United States Patent [19]
Yamaguchi

[11] Patent Number: 5,530,374
[45] Date of Patent: Jun. 25, 1996

[54] METHOD OF IDENTIFYING PROBE POSITION AND PROBING METHOD IN PROBER

[75] Inventor: Masao Yamaguchi, Tokyo, Japan

[73] Assignee: Tokyo Electron Limited, Tokyo, Japan

[21] Appl. No.: 401,231

[22] Filed: Mar. 9, 1995

Related U.S. Application Data

[62] Division of Ser. No. 251,364, May 31, 1994, Pat. No. 5,422,579.

[30] Foreign Application Priority Data

May 31, 1993 [JP] Japan .................................. 5-152854

[51] Int. Cl.$^6$ ............................................. G01R 31/02
[52] U.S. Cl. ..................... 324/758; 324/754; 414/786; 348/94; 348/87; 356/399; 437/8
[58] Field of Search ........................ 324/758, 754; 414/786, 754; 437/8, 924; 348/87, 94; 356/399, 400, 401

[56] References Cited

U.S. PATENT DOCUMENTS

| | | | |
|---|---|---|---|
| 4,786,867 | 11/1988 | Yamatsu | 324/758 |
| 4,929,893 | 5/1990 | Sato et al. | 324/758 |
| 4,966,520 | 10/1990 | Yokota et al. | 414/86 |

*Primary Examiner*—Kenneth A. Wieder
*Assistant Examiner*—Kourosh Cyrus Khosravi
*Attorney, Agent, or Firm*—Oblon, Spivak, McClelland, Maier & Neustadt

[57] ABSTRACT

A marker is provided outside the probe arrangement region of the lower surface of a probe card. In identifying positions of probes, the marker is recognized by a camera before the distal end of a reference probe is recognized. The camera is then moved from the position of the marker based on information about the relative position stored in advance to recognize the distal end of the reference probe. The camera is moved complementarily to make a reference point in the view of the camera and the distal end of the reference probe align with each other. Furthermore, where the same operation is performed for another reference probe, a deviation of the probes in the θ direction is calculated as θ correction data.

11 Claims, 7 Drawing Sheets

METHOD OF IDENTIFYING PROBE POSITION AND PROBING METHOD IN PROBER

This is a Division of application Ser. No. 08/251,364 filed on May 31, 1994, now U.S. Pat. No. 5,422,579.

BACKGROUND OF THE INVENTION

1. Field of the Invention

The present invention relates to a method of identifying a probe position and a probing method in a prober for a substrate to be examined, e.g., a semiconductor wafer.

2. Description of the Related Art

In the semiconductor device manufacturing process, a large number of semiconductor devices are formed as chips on a semiconductor wafer. Then, the wafer is cut into the chips, i.e., the semiconductor devices in a die cut step. In the semiconductor device manufacturing process, before the wafer is cut, the electrical characteristics of the semi-completed semiconductor devices are tested and determined by using a prober. Only the semiconductor devices that are determined as non-defective articles as the result of test measurement are sent to the subsequent steps, e.g., packaging.

The prober has a wafer work table which is made to be movable in the X, Y, Z, and θ directions. A probe card having a large number of probes corresponding to the electrodes pads of a semiconductor device is fixed above the work table with an appropriate holding tool. For measurement, a test target, e.g., a wafer, is placed and held on the work table. The work table is driven, the probes are brought into contact with the electrode pads of the semiconductor device, and test measurement is performed by a tester through the probes.

In order to accurately bring the probes of the prober into electrical contact with the electrode pads of the semiconductor device, the distal ends of the probes must be correctly guided to the electrode pads of the semiconductor device and aligned with them. Conventionally, a specific semiconductor device on the wafer is moved to under the probe card by moving the stage. Then, the distal ends of the probes are recognized by utilizing, e.g., a camera, and manually aligned with the electrode pads of the semiconductor device. In this method, the operator must be specially trained, and the aligning operation becomes very cumbersome. When a probe card, e.g., a probe card having probes of a so-called vertical type, that visually conceals contact between the probes and the electrode pads is used, visual observation for the purpose of alignment is difficult, sometimes making it difficult to perform accurate operation.

A technique of automatical alignment in probers has recently been developed, as disclosed in, for example, Jpn. Pat. Appln. KOKAI Publication No. 61-283138. This technique is based upon a premise that the probes are arranged on a probe card without any error, and the probe card is fixed to a prober correctly. However, it is actually difficult to precisely arrange the probes on the probe card in advance, and differences among probe cards always occur. Even though the probes are arranged on the probe card as previously designed, it is unavoidable to cause some changes by using the probes repeatedly. It is also unavoidable to cause an error in aligning when the probe card itself is attached to the prober.

As the degree of integration of a semiconductor device increases, the number of probes needed to test one semiconductor chip is likely to increase. Recently, a probe card having 1000 to 2000 probes has been required in semiconductor manufacturing processes and, in this case, it is not easy to recognize the distal end of a reference probe of the probes from under the probe card. In a probe card having vertical type probes, when the distal ends of the probes are seen from under the probe card, they are recognized as a set of countless points, and it is not easy to discriminate the reference probe from the others.

SUMMARY OF THE INVENTION

It is an object of the present invention to provide a method of identifying a probe position in a prober that enables the distal end of a reference probe to be easily recognized, and a probing method using this probe position identifying method.

According to a first aspect of the present invention, there is provided, in a prober comprising a probe card having a plurality of probes, a card mounting portion for mounting the probe card, a work table on which a test target is placed opposite to the card mounting portion, the work table being movable within X–Y coordinates, optical detection means attached to the work table and having a view with a reference point, and a controller for controlling a movement of the work table, a method of identifying positions of the probes, after the probe card is mounted on the card mounting portion, comprising the steps of: providing an optically recognizable marker on one surface of the probe card that faces the work table; storing in the controller a relative position of a distal end of a reference probe included in the plurality of probes relative to the marker; mounting the probe card to the card mounting portion; optically detecting a position of the marker provided on the probe card mounted on the card mounting portion; moving the work table by the controller by referring to the relative position, and causing the distal end of the reference probe to fall within the view of the detection means; moving the work table complementarily such that the distal end of the reference probe aligns with the reference point of the view of the detection means; and calculating X–Y correction data about the relative position from the amount of complementary movement of the work table by the controller, and storing the X–Y correction data in the controller.

According to a second aspect of the present invention, there is provided, in a prober comprising a probe card having a plurality of probes, a card mounting portion for mounting the probe card, a work table on which a test target is placed opposite to the card mounting portion, the work table being movable within X–Y coordinates and in a θ direction, optical detection means attached to the work table and having a view with a reference point, and a controller for controlling a movement of the work table, a method of identifying positions of the probes, after the probe card is mounted on the card mounting portion, comprising the steps of: providing an optically recognizable marker on one surface of the probe card that faces the work table; storing in the controller relative positions of distal ends of first and second reference probes included in the plurality of probes relative to the marker; mounting the probe card to the card mounting portion; optically detecting a position of the marker provided on the probe card mounted on the card mounting portion; moving the work table by the controller by referring to the relative positions, and causing the distal end of the first reference probe to fall within the view of the detection means; moving the work table complementarily such that the distal end of the first reference probe aligns with the reference point of the view of the detection means;

calculating first X–Y correction data about the relative positions from the amount of complementary movement of the work table for the first reference probe by the controller, and storing the first X–Y correction data in the controller; moving the work table by the controller by referring to the relative positions, and causing the distal end of the second reference probe to fall within the view of the detection means; moving the work table complementarily such that the distal end of the second reference probe aligns with the reference point of the view of the detection means; calculating second X–Y correction data about the relative positions from an amount of complementary movement of the work table for the second reference probe by the controller, and storing the second X–Y correction data in the controller; and calculating a deviation of the probes from a condition concerning an angular orientation that should be set with respect to the card mounting portion, from the first and second X–Y correction data, by the controller, and storing the deviation in the controller as θ correction data.

According to the present invention, an easily recognizable marker is recognized first, without directly recognizing the distal end of a reference probe. The distal end of the reference probe is recognized from a position of the marker, based on data stored in advance. Thus the distal end of the reference probe can be easily found. When the recognized distal end of the reference probe is aligned with a reference point within a view of a camera, an error due to differences among probe cards or changes caused by repeatedly using probes, can be obtained as X–Y correction data. A deviation of the probes in the θ direction is calculated from positional information about two reference probes, and can be stored as θ correction data. By applying the conventional image recognizing technique to the above steps, the positions of the probes can be identified automatically.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The arrangement and operation of a prober as a whole for a semiconductor wafer according to an embodiment of the present invention will be schematically described with reference to FIGS. 1 to 3.

Figure 1:
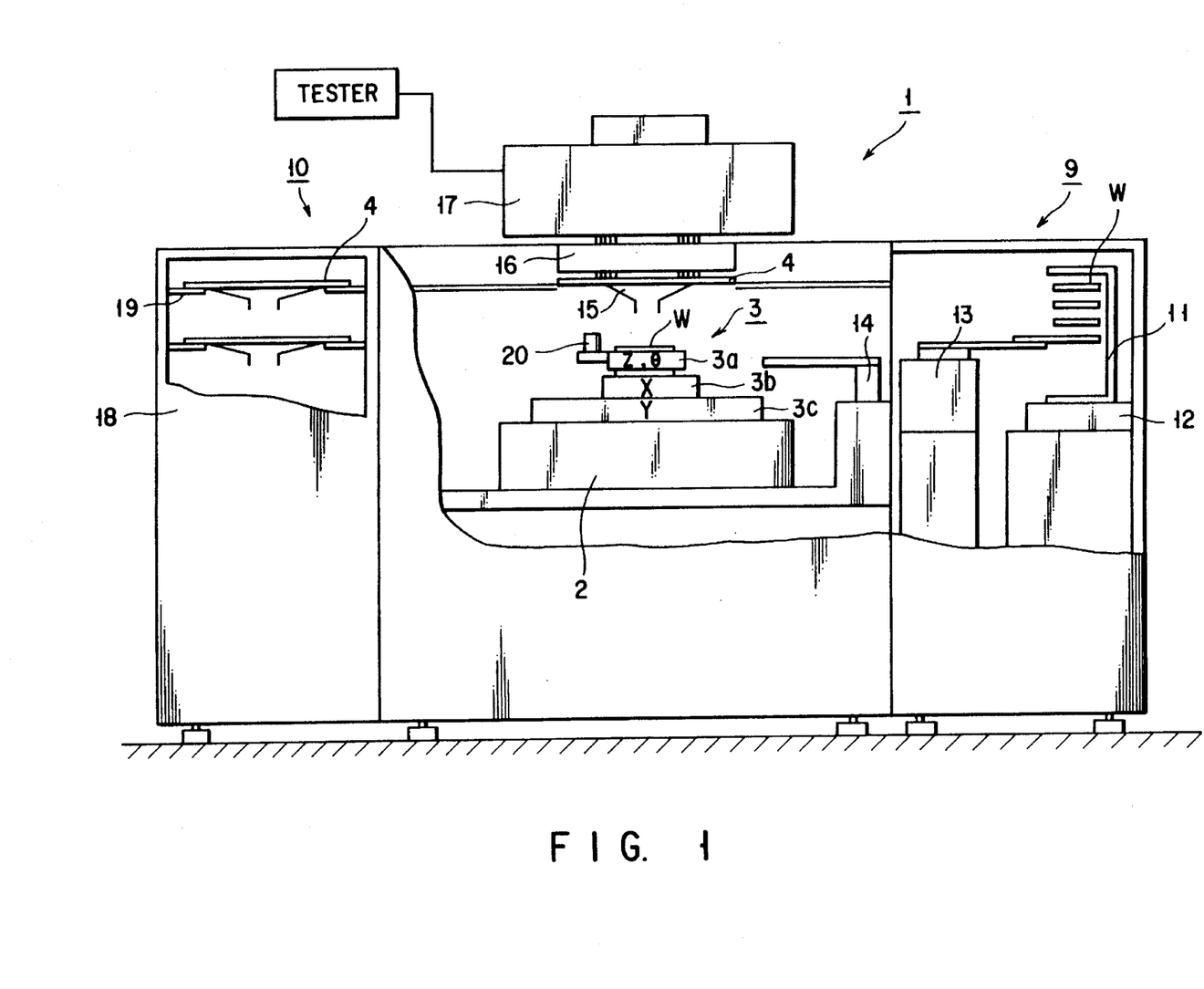
FIG. 1 is a schematic side view showing a prober according to an embodiment of the present invention.

Referring to FIG. 1, a stage base 2 is provided at substantially the center of a prober 1. A work table 3 for placing a semiconductor wafer W thereon and holding it by vacuum suction is mounted on the stage base 2. As shown in FIG. 3, the work table 3 is constituted by a Z- and θ-direction stage 3a, an X-direction stage 3b, and a Y-direction stage 3c, and is movable in a desired direction on the stage base 2. A probe card 4 for probe examination can be mounted on a card mounting portion above the work table 3 to oppose the semiconductor wafer W.

Figure 2:
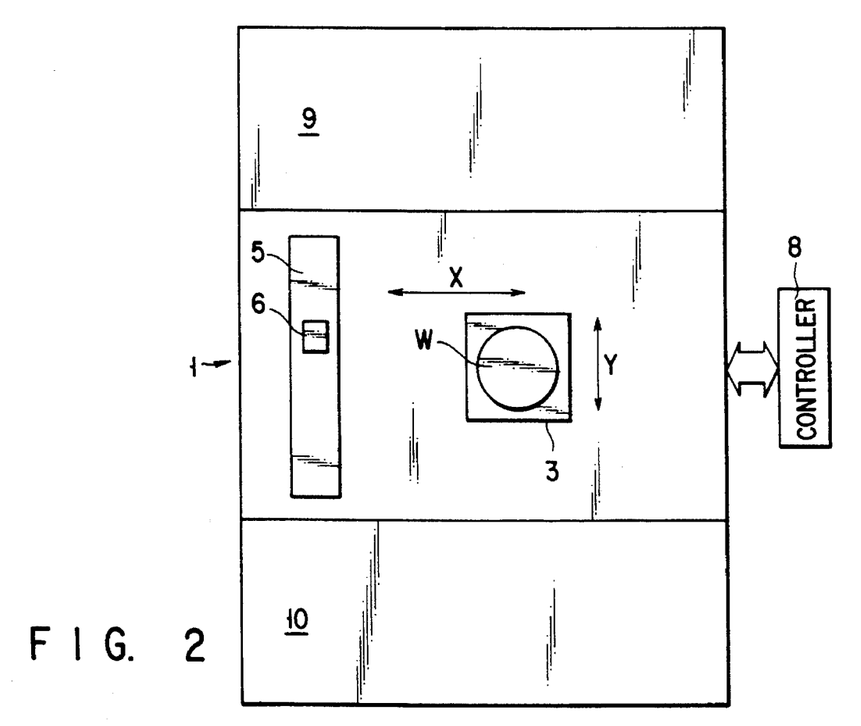
FIG. 2 is a layout plan view showing the prober shown in FIG. 1.
Figure 3:
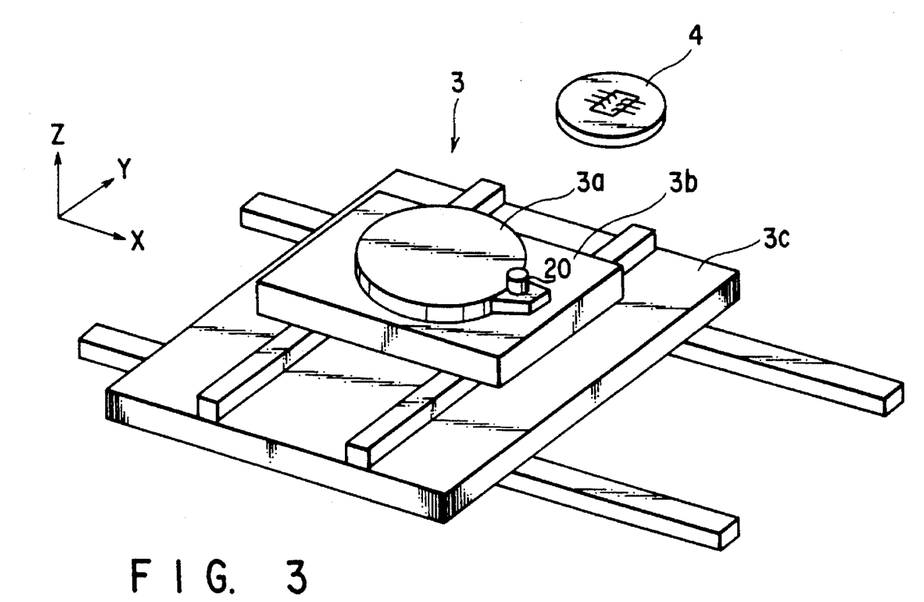
FIG. 3 is a perspective view showing the wafer work table of the prober shown in FIG. 1 and its driving stage.

As shown in FIG. 2, an alignment unit 5 is provided at the center of the prober 1. The alignment unit 5 is provided with an image recognition unit for alignment, e.g., a camera 6. When alignment is to be performed, the work table 3 is moved to a position under the camera.

A control stick is arranged on a control panel (not shown). The control stick is operated by the operator so as to manually control the moving amount of the work table 3 on the order of microns. Furthermore, the driving mechanism of the work table 3 is connected to a controller 8. Thus, the work table 3 can be driven in the X, Y, Z, and θ directions in accordance with a control signal from the controller 8, thereby aligning the electrode pads of the semiconductor wafer W placed on the work table 3 with the probe card 4.

An auto loader 9 for loading in/out the semiconductor wafer W is arranged on the right side (FIG. 1) of the prober 1. An exchanger 10 for exchanging the probe card 4 is provided on the left side (FIG. 1) of the prober 1.

In the auto loader 9, a wafer cassette 11 housing a plurality of semiconductor wafers W at regular intervals with each other in the vertical direction is replaceably arranged on a cassette work table 12. A loader stage 13 which is movable in the horizontal plane and a wafer handling arm 14 which can be driven by a Y-direction driving mechanism and a Z-direction moving mechanism (neither are shown) are provided between the wafer cassette 11 and the work table 3.

When a semiconductor wafer W is to be probed by the probe card 4, the wafer W is conveyed by the loader stage 13 to be close to the work table 3, and then is transferred by the wafer handling arm 14 such that it is placed and held on the work table 3. Thereafter, probes 15 of the probe card 4 which is accurately positioned at a predetermined position by a method to be described later are brought into contact with predetermined contact points, e.g., electrodes pads, on the wafer W. The probes 15 are connected to a test head 17 through a pogo-pin ring 16, and the test head 17 is connected to a tester.

For examination, a test signal is sent to the each chip from the tester, and the electrical characteristics of the respective chips are measured in accordance with the response signals sent back from the respective chips. That is, the non-defectiveness or defectiveness of each semiconductor device formed on the wafer W as the test target is determined by the tester. After the examination is completed, the wafer W is moved again onto the loader stage 13 by the wafer handling arm 14 and conveyed to the wafer cassette 11 by the loader stage 13.

In the exchanger 10, a plurality of probe cards 4 of one or more types corresponding to the semiconductor devices formed on the semiconductor wafer W as the test target are housed on housing shelves 19 of a housing chamber 18 at intervals with each other in the vertical direction. The housed probe cards 4 are exchanged as required for the probe card 4 provided in the main body of the prober 1.

An image recognizing means, e.g., a camera 20, is provided on a side of the Z- and θ-direction stage 3a of the work table 3 and can recognize the image of the lower surface of the probe card 4. The camera 20 can be driven to a desired position together with the work table 3 by driving the Z- and θ-direction stage 3a, the X-direction stage 3b, and the Y-direction stage 3c by the control signal from the controller 8.

Probe cards 4 that can be adopted in the probe apparatus 1 will be described with reference to FIGS. 4 to 6.

Figure 4:
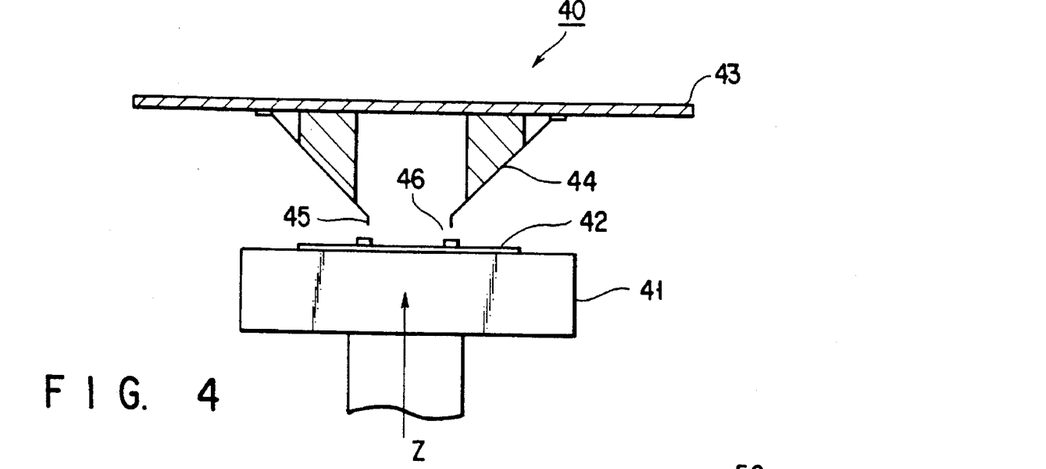
FIG. 4 is a schematic sectional view showing a probe card having probes of a horizontal type.

FIG. 4 shows a probe card 40 having probes of a so-called horizontal type. The probe card 40 has a probe card substrate 43 which is arranged to be substantially parallel to the examination surface of a substrate 42 to be tested, e.g., a wafer, placed on a work table 41. Probes 44 made of a conductor, e.g., gold (Au) or tungsten (W), are mounted on the probe card substrate 43 to be downwardly inclined, thus forming an angle with the probe card substrate 43. Distal ends 45 of the probes 44 are position-adjusted such that they are abutted against corresponding electrode pads 46 of the substrate 42.

For examination, the work table 41 is driven by a driving unit (not shown) in a direction indicated by an arrow Z, thereby bringing the distal ends 45 of the respective probes 44 into electrical contact with the electrode pads 46. A test signal is sent from the tester to each chip. The electrical characteristic test is executed for the respective chips in accordance with the response signals sent back from the respective chips.

Figure 5:
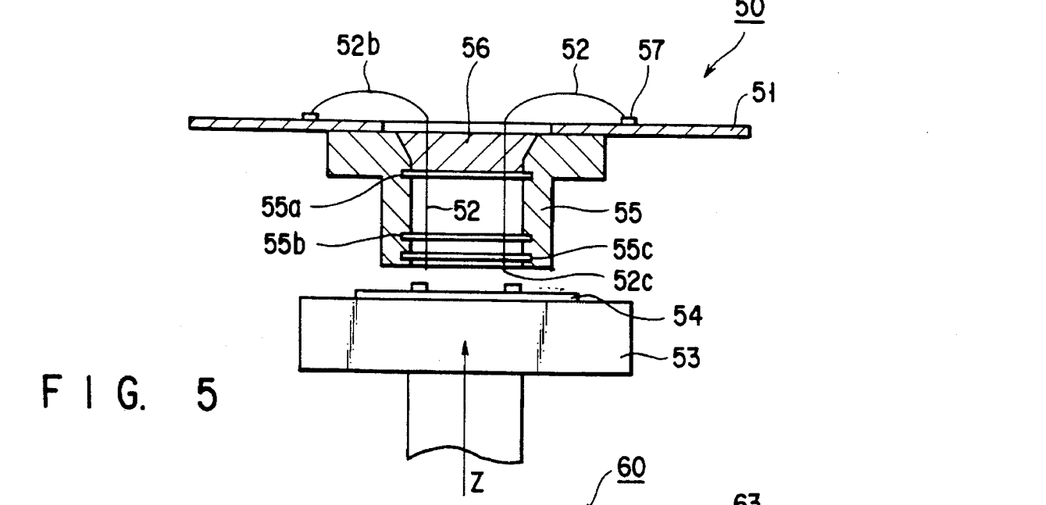
FIG. 5 is a schematic sectional view showing a probe card having probes of a vertical type.

FIG. 5 shows a probe card 50 having probes of a so-called vertical type. The probe card 50 has a substantially disk-shaped probe card substrate 51, probes 52, and a guide portion 55 for guiding the probes 52 to a substrate 54 to be tested, e.g., a wafer, placed on a work table 53. Each probe 52 is made of a conductor, e.g., gold (Au) or tungsten (W), and its lower portion 52a is arranged to be perpendicular to the inspection substrate.

The guide portion has a probe fixing plate 55a, an upper guide plate 55b, and a lower guide plate 55c from its upper portion in this order. Holes capable of mounting the corresponding probes 52 therein by insertion are formed in these plate members 55a, 55b, and 55c. The probes 52 are mounted by insertion in the corresponding holes and fixed by a fixing resin 56. Upper portions 52b of the probes are bent in the arched manner and electrically connected to the probe card substrate 51 at points 57.

For examination, the work table 53 is driven in the direction indicated by an arrow Z, and distal end portions 52c of the probes are abutted against electrode pads 58 of the substrate 54 to be tested. At this time, the probes 52 are elastically flexed between the probe fixing plate 55a and the upper guide plate 55b to absorb the force in the vertical direction. In this manner, a test signal is sent from the tester to the probes 52 electrically connected to the electrode pads 58 of the substrate 54, and the electrical characteristics of the respective chips are measured in accordance with response signals sent from the respective chips.

Figure 6:
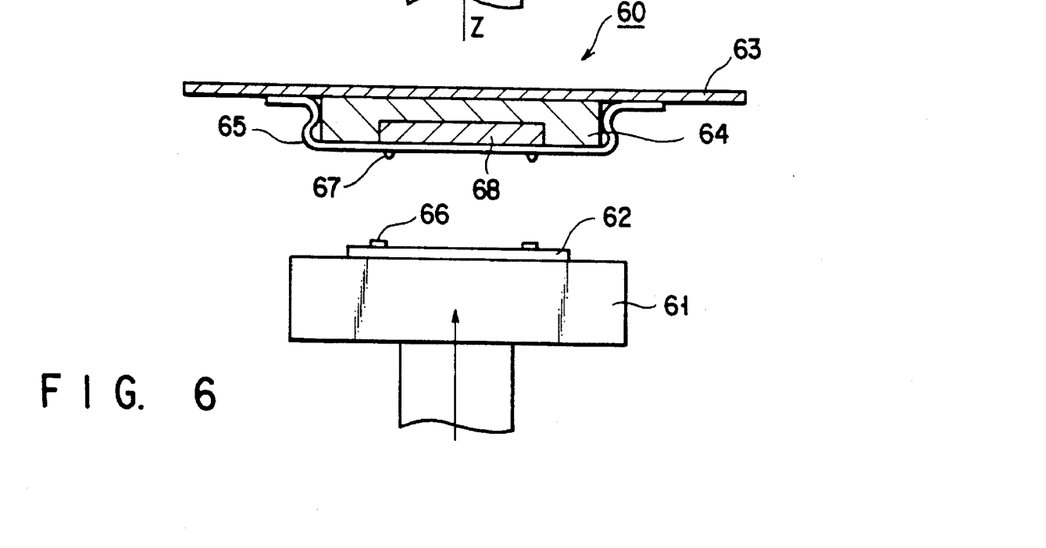
FIG. 6 is a schematic sectional view showing a probe card having probes of a bump type.

FIG. 6 shows a probe card 60 having probes of a so-called bump type. The probe card 60 has a probe card substrate 63 arranged to be substantially parallel to the examination surface of a substrate 62 to be tested, e.g., a wafer, placed on a work table 61. A block 64 is mounted to the lower surface of the probe card substrate 63, and an elastic membrane substrate 65 is arranged to cover the block 64. Bumps 67 made of a conductor, e.g., gold (Au) or tungsten (W), are mounted at positions of the membrane substrate 65 corresponding to electrode pads 66 on the substrate 62 to be tested. Furthermore, a damper member 68 is arranged on the rear side of the bumps 67 to absorb the pressure caused by contact of the bumps 67 and the electrode pads 66.

For examination, the work table 61 is driven by a driving unit (not shown) in a direction indicated by an arrow Z, and the bumps 67 and the electrode pads 66 are brought into electrical contact with each other. A test signal is sent from the tester to each chip, and the electrical characteristic test is executed for the respective chips in accordance with response signals sent back from the respective chips.

The present invention can be applied to any types of the probe cards described above.

A case wherein a semiconductor chip circuit is subjected to the probing test by the prober 1 will be described with reference to FIGS. 1 to 3 and 7.

Figure 7:
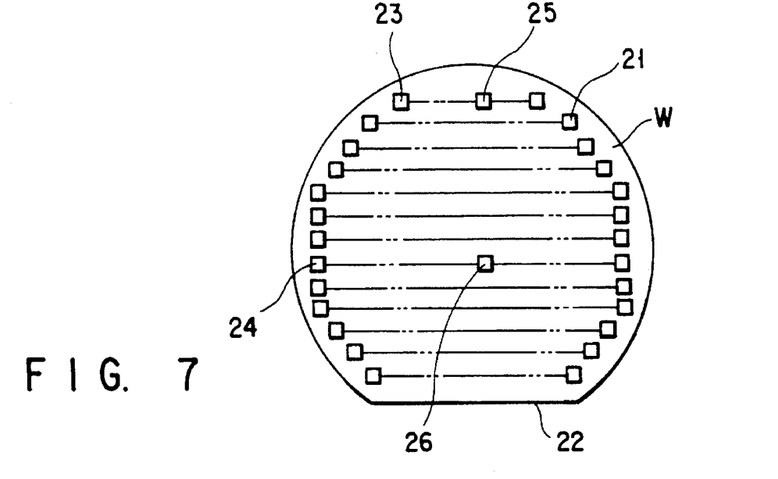
FIG. 7 is a plan view showing the semiconductor device-forming surface of a semiconductor wafer as a test target.

As shown in FIG. 7, a large number of chips 21 are formed on the semiconductor wafer W. An orientation flat 22 is formed in the wafer W. The wafer W is pre-aligned by setting the orientation flat 22 in a desired direction on the loader stage 13. After pre-alignment, the wafer W is placed on the work table 3 of the stage base 2 by the convey arm 14. As a result, the wafer W as the test target opposes the probe card 4.

The probe test can be performed, e.g., by dividing one semiconductor wafer W into four areas. More specifically, the test is conducted in the order of for the upper left area, upper right area, lower left area, and lower right area shown in FIG. 7. For example, 64 semiconductor chips 21 are formed in each area. A plurality of electrode pads are formed on each chip 21, and one of the electrode pads is selected as a reference electrode pad. Usually, as the reference electrode pad, one of the electrode pads formed on a chip 23, 24, 25, or 26 at the upper left portion of each area which is located on the upper left corner of the chip is selected.

For examination, a corresponding reference probe is brought into electrical contact with the reference electrode pad, and the directions of the wafer W on the work table 3 and the probe card 4 in the direction are accurately aligned, so that other probes are also aligned to be able to electrically contact the corresponding electrode pads. For this purpose, the work table 3 must be moved first in the X–Y plane, the distal end position of the reference probe must be detected by the camera 20 mounted to the work table 3, and the positional information must be stored in the controller 8 (teaching step). This teaching step is necessary because the distal end position of the reference probe is slightly deviated from the ideal position.

Conventionally the teaching step has been executed by directly viewing the distal ends of the probes 15 through the camera 20 to recognize them. However, as the density of the probes is increased in accordance with high degree of integration of semiconductor devices, the direct viewing becomes difficult. In vertical type probes or bump type probes wherein, when the distal ends of the probes are viewed from under the probe card, they are recognized as a set of countless points, it is not easy to discriminate between the distal ends of adjacent probes.

Figure 8:
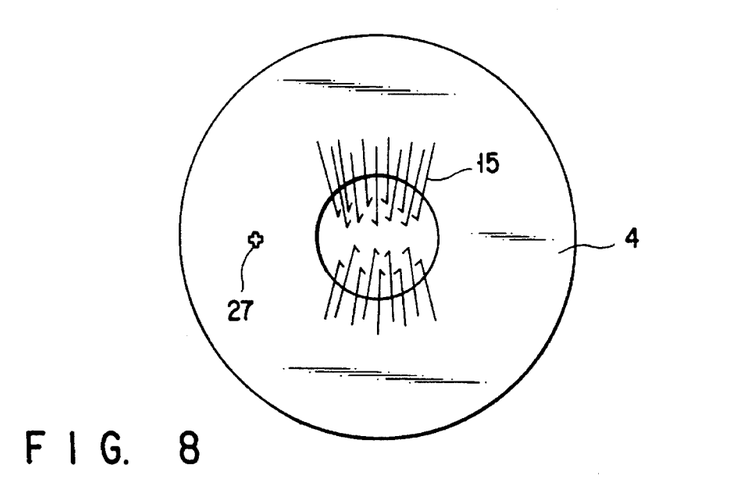
FIG. 8 is a schematic view showing a probe card with a marker.

To resolve this problem, in the probe card 4 of the present invention, a marker 27 is formed, as shown in FIG. 8, at a location separated from the arrangement region of the probes 15 of the lower surface of the probe card 4, and viewed and recognized by the camera 20. The first embodiment of the present invention will now be described, with reference to the flowchart shown in FIG. 12.

Figure 12:
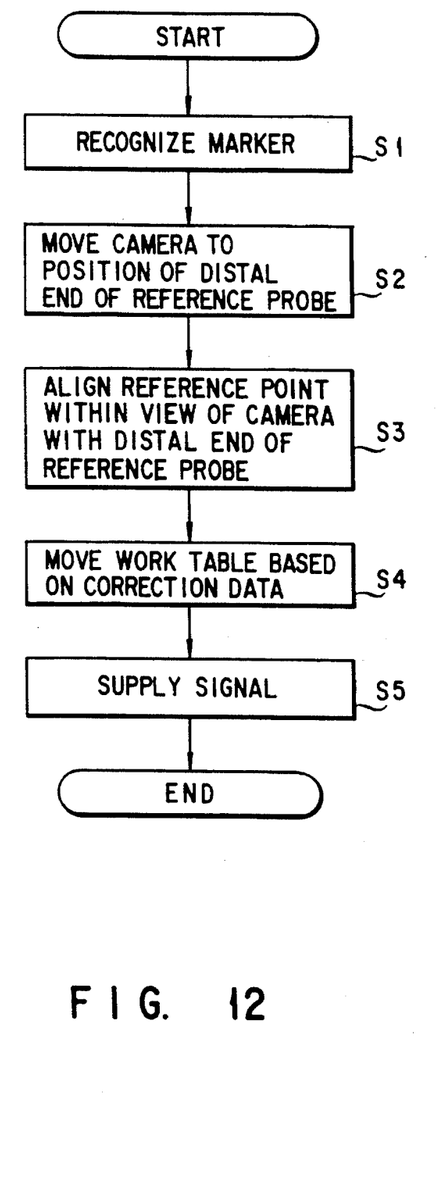
FIG. 12 is a flowchart showing a probing method according to a first embodiment of the present invention.

At the first step S1, an image of the lower surface of the probe card 4 is recognized by the camera 20 provided on the work table 3 to find the marker 27. Unlike the conventional technique of directly recognizing the distal ends of the probes 15, the marker can easily be distinguished from its surroundings, and thus recognized quickly using a conventional image recognizing technique.

Figure 9:
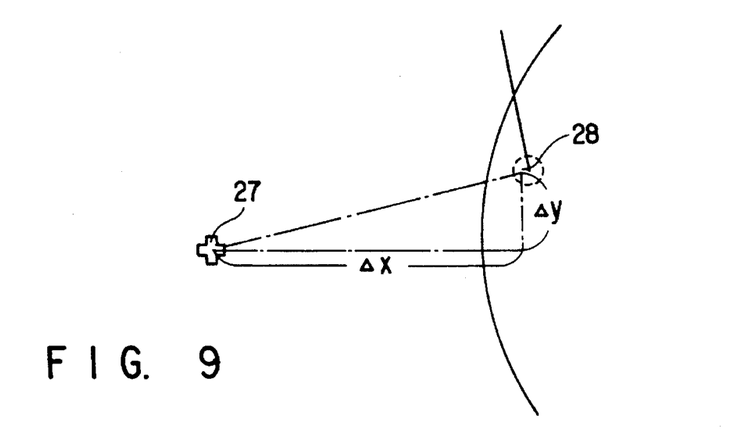
FIG. 9 is a schematic view showing a relationship in position between the marker and the distal end of a reference probe.
Figure 10:
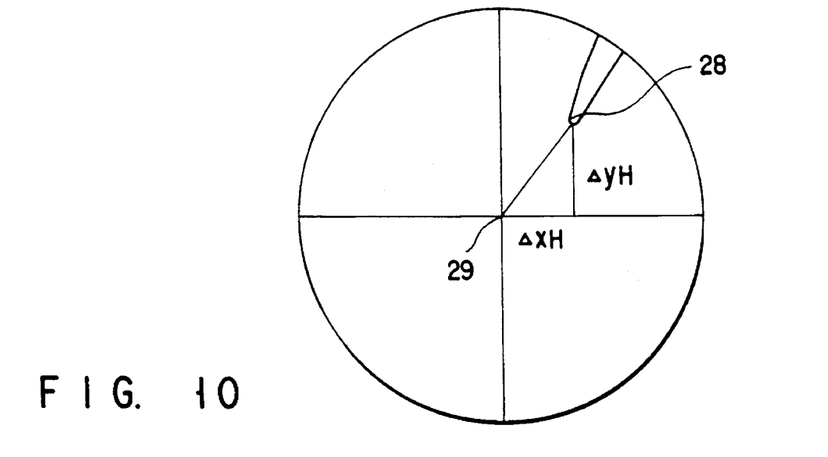
FIG. 10 is a schematic view showing a relationship in position between a reference point in the view of a camera and the distal end of the probe.

The work table 3 is then driven to move the view of the camera 20 to the vicinity of the distal end 28 of the reference probe. As shown in FIG. 9, information (Δx, Δy) on the relative position of the marker 27 to the distal end 28 of the reference probe is stored in advance in a memory of the controller 8. Therefore, at the second step S2, the view of the camera 20 can be moved to the vicinity of the distal end 28 of the reference probe, as shown in FIG. 10.

Figure 11:
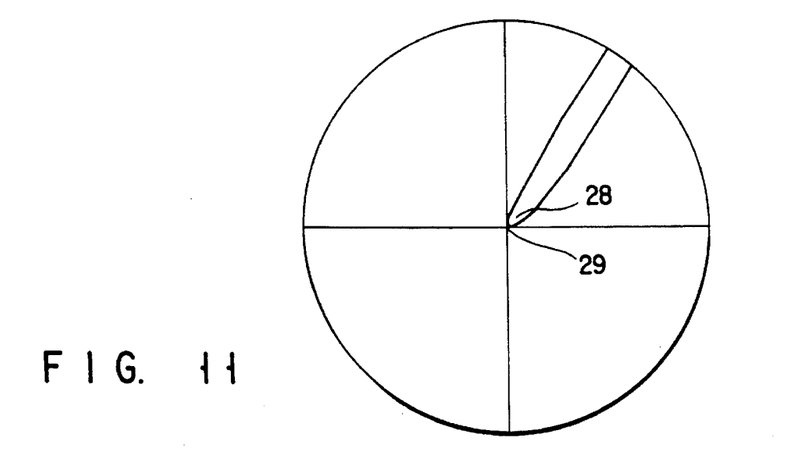
FIG. 11 is a schematic view showing a corrected relationship in position between the reference point in the view of the camera and the distal end of the probe.

If the probes 15 were arranged on the probe card 4 accurately, and if the probe card were provided in the prober 1 exactly, the distal end 28 of the reference probe would correctly align with a reference point 29 within the view of the camera 20, obtained by the movement at the second step S2, as illustrated in FIG. 11.

In point of fact, the probes 15 are not arranged correctly on the probe card 4, or the ends of the probes are shifted in position because of their repeated use even though they are arranged correctly, or the probe card 4 itself is not provided exactly in the prober 1. Therefore, the reference point 29 and the distal end 28 of the reference probe do not align with each other, as shown in FIG. 10.

In the present invention, at the third step S3, correction is performed by moving the work table 3 so that the reference point 29 and the distal end 28 of the reference probe align with each other, as shown in FIG. 11. Then, X–Y correction data (ΔxH, ΔyH) is calculated by the controller 8 from the amount of correctional displacement of the work table 3. The stored information on the relative position of the marker 27 to the distal end 28 of the reference probe is corrected based on the X–Y correction data.

If the θ direction or angular orientation of the probes 15 substantially coincides with a preset value, the required correction data is ΔxH and ΔyH only. Similarly, when information on a deviation in the θ direction is detected in advance and stored in the memory of the controller 8, the required correction data is ΔxH and ΔyH. If, however, the angular orientation of the probes 15 is deviated and unidentified, the deviation in the angular orientation should be detected at the same time.

To detect the deviation in the angular orientation, it is desirable to set a plurality of reference probes as in the second embodiment described later. Where the number of the reference probe is one as in the first embodiment, if the ideal position of the marker 27 or the reference probe in the absolute coordinates of the prober is recognized, the deviation of the probes 15 in angular orientation, that is, the θ correction data can be acquired by using information on the ideal position, the detected position of the marker 27, and the detected position of the distal end 28 of the reference probe.

Then the wafer W is placed on the work table 3 to carry out the actual test. The wafer W can be placed on the work table 3 prior to the first step for obtaining the correction data. In testing, at the fourth step S4, the X–Y correction data obtained at the above teaching step is used and, if necessary, the θ correction data is used, resulting in index movement of the work table.

Regarding the difference in set position of the wafer W mounted on the work table 3 from one wafer to another in examination, automatic alignment as described in U.S. patent application Ser. No. 430,589 (U.S. Pat. No. 4,966, 520) filed on Nov. 1, 1989 or Jpn. Pat. Appln. KOKAI Publication No. 2-224260 is performed, the teachings of which are hereby incorporated by reference.

More specifically, first, the camera 6 of the alignment unit 5 is used to detect the aligning direction of the semiconductor chips that are arranged on the wafer W. The wafer W is rotated such that the aligning direction coincides with the moving direction of the work table 3. Thus, the aligning direction of the electrode pads of the chips is aligned with the direction of the probes 15. At the same time, of the reference patterns stored in advance in the memory of the controller 8, one that coincides with the detected chip aligning pattern is selected. The wafer is moved from a position under the wafer alignment unit 5 to a position under the probe card 4 along the corrected coordinates, thereby automatically aligning the electrode pads of the chips with the probes 15.

As described above, the distal ends of the probes are brought into correct contact with their corresponding electrode pads of the semiconductor chips, by driving the work table 3 on the basis of the X–Y correction data and θ correction data. At the fifth step S5, a test signal is supplied to the semiconductor chips from a tester through the probes 15. The electrical characteristics of the semiconductor chips are measured in accordance with response signals sent back from the semiconductor chips.

The first to third steps can be easily automated using the conventional image recognition technique. By automating the alignment operation of the prober according to the present invention, test time can be shortened and work can be saved.

The second embodiment of the present invention will now be described, with reference to FIGS. 13 and 14. In the second embodiment, a deviation of the probes 15 in the θ direction (mainly caused when the probe card 4 is mounted on the card mounting portion of the prober 1) is measured by obtaining positional information on the distal ends of two reference probes.

Figure 13:
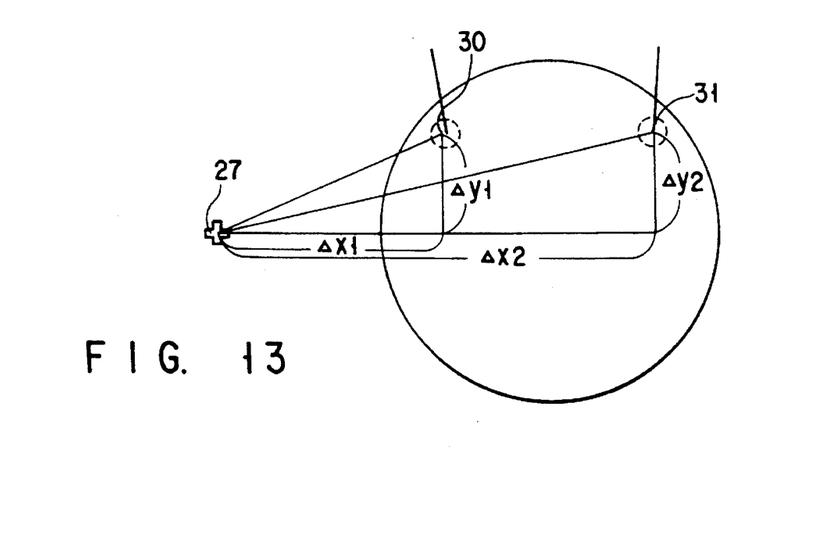
FIG. 13 is a schematic view showing a relationship in position between a marker and first and second reference probes.
Figure 14:
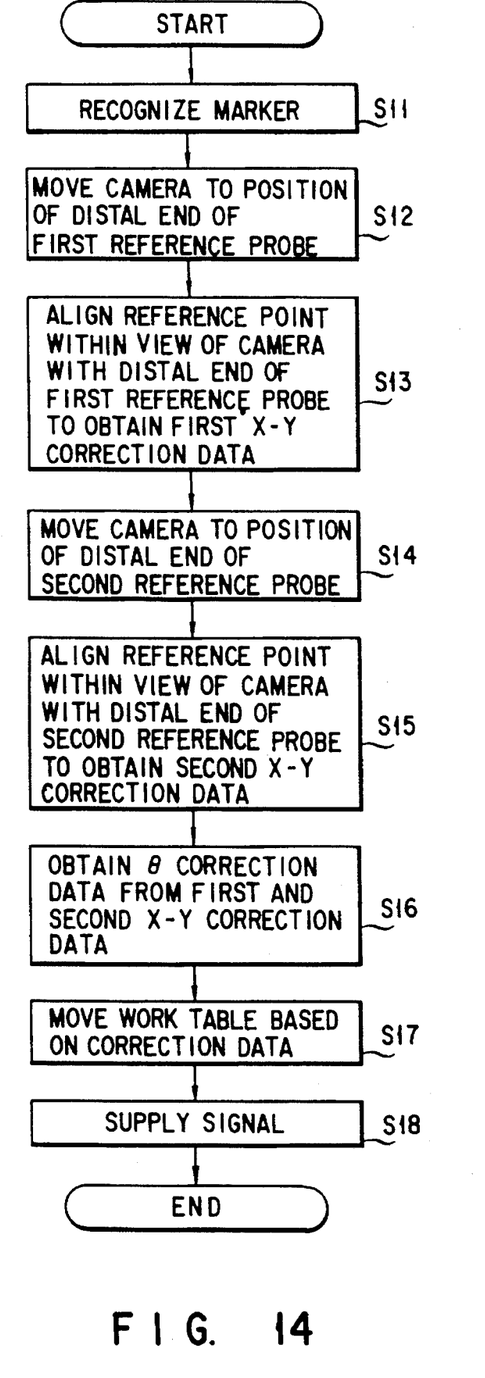
FIG. 14 is a flowchart showing a probing method according to a second embodiment of the present invention.

Like the first embodiment, at the first step S11 of the second embodiment, the marker 27 shown in FIG. 13 is found by recognizing an image of the lower surface of the probe card 4 by the camera 20 attached to the work table 3.

At the second step S12, the work table 3 is driven to move the view of the camera 20 to near the distal end 30 of the first reference probe. As in the first embodiment, information (Δx, Δy) on the relative position of the marker 27 to the distal end 30 of the first reference probe is stored in advance in the memory of the controller 8. Therefore, at the second step S12, the view of the camera 20 can be moved to near the distal end 30 of the first reference probe.

At the third step S13, correction is performed by moving the camera 20 such that the reference point 29 of the view of the camera 20 and the distal end 30 of the first reference probe align with each other, and the result of the correction is calculated by the controller 8 and stored in the memory thereof as the first X–Y correction data.

At the fourth step S14, the work table 3 is driven to move the view of the camera 20 to the vicinity of the distal end 31 of the second reference probe. In this case, too, information (Δx2, Δ2) on the relative position of the marker 27 to the distal end 31 of the second reference probe or information (Δx2–Δx1, Δy2–Δy1) on the relative position of the distal end 30 of the first reference probe to the distal end 31 of the second reference probe, is stored in advance in the memory of the controller 8. Therefore, at the second step S12, the view of the camera 20 can be moved to the vicinity of the distal end 31 of the reference probe, as shown in FIG. 10.

At the fifth step S15, correction is performed such that the reference point 29 of the view of the camera 20 and the distal end 31 of the second reference probe align with each other, and the result of the correction is calculated by the controller 8 and stored in the memory thereof as the second X–Y correction data.

When a deviation in the angular orientation, that is, a deviation in the θ direction occurs in the probes 15, there occurs a difference between the first X–Y correction data and second X–Y correction data obtained at the third and fifth steps S13 and S15. Therefore, at the sixth step S16, the deviation of the probes 15 in the θ direction is calculated from the difference, and stored in the controller 8 as θ correction data. The stored information on the relative position of the marker 27 to the distal end of each reference probe is corrected based on the first and second X–Y correction data.

Then the wafer W is placed on the work table 3 to carry out the actual test. The wafer W can be placed on the work table 3 prior to the first step for obtaining the correction data. In testing, at the seventh step S17, the X–Y correction data and θ correction data obtained at the above teaching step are used, resulting in index movement of the work table 3.

Regarding the difference in set position of the wafer W mounted on the work table 3 from one wafer to another in examination, automatic alignment as described above in relation to the first embodiment is performed.

As described above, the distal ends of the probes are brought into correct contact with their corresponding electrode pads of the semiconductor chips, by driving the work table 3 on the basis of the X–Y correction data and θ correction data. At the eighth step S18, a test signal is supplied from a tester to the semiconductor chips through the probes 15. The electrical characteristics of the semiconductor chips are measured in accordance with response signals sent back from the semiconductor chips.

Figure 15:
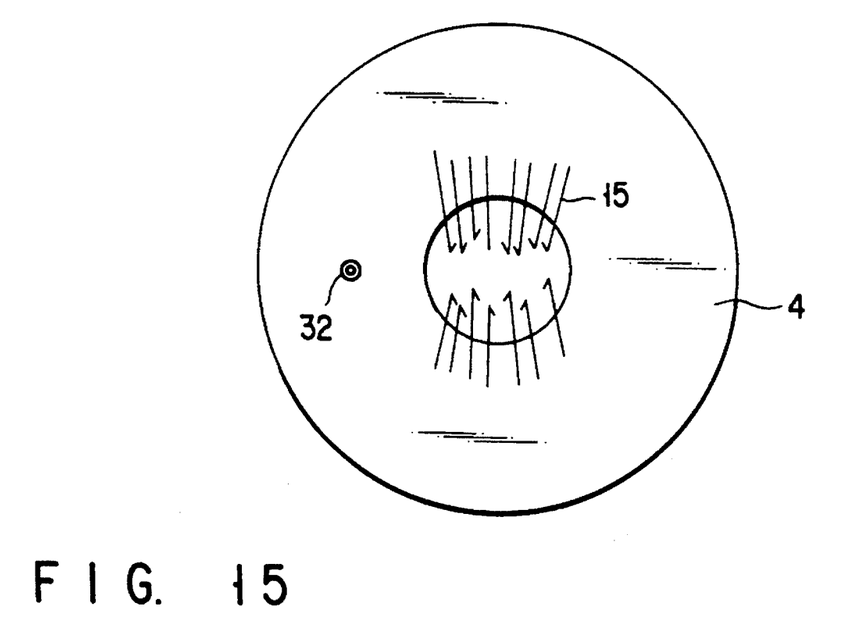
FIG. 15 is a schematic view showing a modification to the marker.

The marker 27 may be formed so as to have a color different from the background color of the lower surface of the probe card 4 in order that it can easily be found by the camera 20. As shown in FIG. 15, a light-emitting element 32 can be employed as a marker and, in this case, the position of the marker can be recognized by using a light-receiving element mounted on the work table 3.

Figure 16:
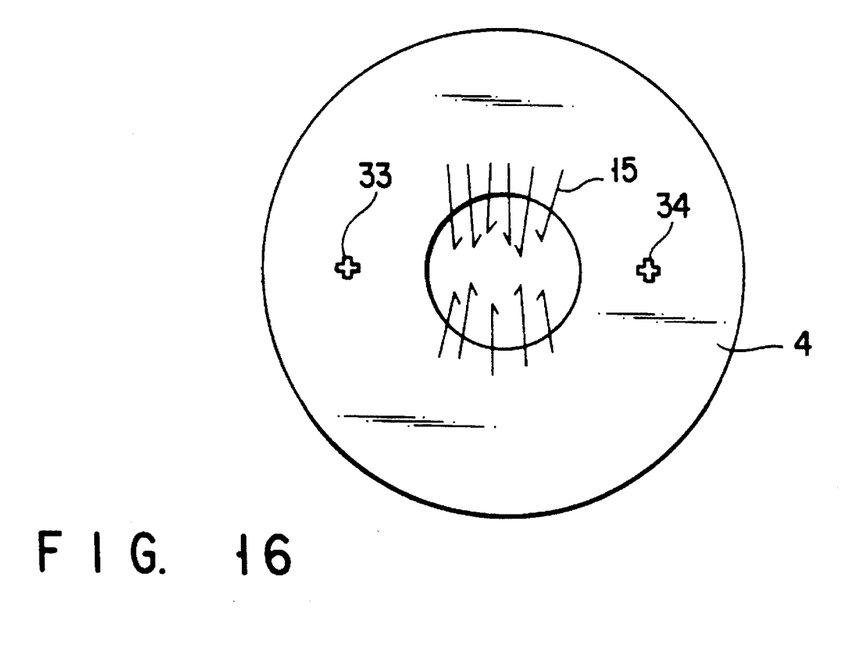
FIG. 16 is a schematic view showing another modification to the marker.

Furthermore, as shown in FIG. 16, a plurality of markers 33 and 34 can be mounted on the lower surface of the probe card 4. If information on the relative positions of the markers are obtained and compared with a reference point located outside the probe card 4, a shift of the probe card 4 from the ideal position thereof in the prober 1 can be known. Based on this result and the information on the relative positions of the distal ends of the first and second reference probes, it is possible to determine whether the deviation of the distal ends of the probes in the θ direction depends upon the shift of the probe card from the ideal position in the prober or that of the probes in relation to the probe card.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. In a prober comprising a probe card having a plurality of probes, a card mounting portion for mounting said probe card, a work table on which a test target is placed opposite to said card mounting portion, said work table being movable within X–Y coordinates, optical detection means attached to said work table and having a view with a reference point, a controller for controlling a movement of said work table, and a tester connected to said probes, a method of probing said test target, comprising the steps of:

providing an optically recognizable marker on one surface of said probe card that faces said work table;

storing in said controller a relative position of a distal end of one reference probe included in said plurality of probes relative to said first reference marker;

mounting said probe card to said card mounting portion;

optically detecting a position of said first reference marker provided on said probe card mounted on said card mounting portion;

moving said work table by said controller by referring to the relative position, and causing the distal end of said reference probe to fall within the view of said detection means;

moving said work table complementarily such that the distal end of said reference probe aligns with the first reference point of the view of said detection means;

calculating X–Y correction data about the relative position from the amount of complementary movement of said work table by said controller, and storing the X–Y correction data in said controller;

placing said test target on said work table;

driving said work table through said controller by referring to said X–Y correction data, and bringing said probes into contact with said test target; and sending a test signal from said tester to said test target through said probes, and examining electrical characteristics of said test target by said tester in accordance with a response signal sent back from said test target.

2. A method according to claim 1, wherein the position of said first reference marker is detected by said detection means.

3. A method according to claim 2, wherein said work table is movable in a Z direction, and said probes and said test target are brought into contact with each other by moving said work table in the Z direction.

4. A method according to claim 3, wherein said first reference marker has a color different from a color of said probe card around said marker.

5. A method according to claim 3, wherein said first reference marker comprises a light-emitting element.

6. A method according to claim 3, wherein said work table is movable in a θ direction, said plurality of probes have a condition concerning an angular orientation that should be set with respect to said card mounting portion, and the condition is not substantially satisfied when said probe card is mounted on said card mounting portion, said method further comprising a step of storing a deviation of said probes in the angular orientation in said controller as θ correction data, and a step of driving said work table through said controller and bringing said probes into contact with said test target by referring to the θ correction data in addition to the X–Y correction data.

7. A method according to claim 1, wherein said work table is movable in a θ direction comprising the steps of:

storing in said controller a relative position of a distal end of a second reference probe including in said plurality of probes relative to a second reference marker;

moving said work table by said controller by referring to the relative positions of the first reference marker and the second reference marker;

said step of calculating X–Y correction data comprising, calculating first X–Y correction data about the relative positions from the amount of complementary movement of said work table for said first reference probe by said controller, and storing the first X–Y correction data in said controller, moving said work table by said controller by referring to the relative positions, and causing the distal end of said second reference probe to fall within the view of said detection means, moving said work table complementarily such that the distal end of said second reference probe aligns with the reference point of the view of said detection means, calculating second X–Y correction data about the relative positions from an amount of complementary movement of said work table for said second reference probe by said controller, and storing the second X–Y correction data in said controller, calculating a deviation of said probes from a condition concerning an angular orientation that should be set with respect to said card mounting portion, from said first and second X–Y correction data, by said controller, and storing the deviation in said controller as θ correction data; and said driving step comprising driving said work table through said controller by referring to said first and second X–Y correction data and said θ correction data, and bringing said probes into contact with said test target.

8. A method according to claim 7, wherein the position of said second reference marker is detected by said detection means.

9. A method according to claim 8, wherein said work table is movable in a Z direction, and said probes and said test target are brought into contact with each other by moving said work table in the Z direction.

10. A method according to claim 9, wherein said second reference marker has a color different from a color of said probe card around said marker.

11. A method according to claim 9, wherein said second reference marker comprises a light-emitting element.

* * * * *